United States Patent
Yamamoto

(10) Patent No.: US 7,307,303 B2
(45) Date of Patent: Dec. 11, 2007

(54) SEMICONDUCTOR DEVICE AND METHOD FOR MANUFACTURING SAME

(75) Inventor: Ichiro Yamamoto, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 262 days.

(21) Appl. No.: 11/120,995

(22) Filed: May 4, 2005

(65) Prior Publication Data

US 2005/0212031 A1    Sep. 29, 2005

Related U.S. Application Data

(63) Continuation of application No. 10/746,341, filed on Dec. 29, 2003, now Pat. No. 6,903,398.

(30) Foreign Application Priority Data

Dec. 27, 2002   (JP)   .............. 2002-380063

(51) Int. Cl.
*H01L 29/76* (2006.01)
*H01L 29/94* (2006.01)

(52) U.S. Cl. .............. 257/295; 257/303; 257/306; 257/310; 438/3; 438/244; 438/253; 438/387

(58) Field of Classification Search .............. 257/295, 257/303, 306, 310; 438/3, 244, 253, 387
See application file for complete search history.

(56) References Cited

U.S. PATENT DOCUMENTS

| 2002/0058391 A1* | 5/2002 | Kim et al. ................. 438/396 |
| 2002/0163025 A1 | 11/2002 | Vaartstra et al. |
| 2004/0072401 A1 | 4/2004 | Iizuka et al. |

FOREIGN PATENT DOCUMENTS

| JP | H11-233726 A | 8/1999 |
| JP | 2002-222934 A | 8/2002 |

* cited by examiner

*Primary Examiner*—Kenneth Parker
*Assistant Examiner*—Joseph Nguyen
(74) *Attorney, Agent, or Firm*—Sughrue Mion Pllc.

(57) ABSTRACT

A semiconductor device is provided which has a capacitor insulating film made up of zirconium aliminate being an amorphous film obtained by having crystalline dielectric contain amorphous aluminum oxide and having its composition of $Al_XZr_{(1-X)}O_Y$ ($0.05 \leq x \leq 0.3$), hereby being capable of preventing, in a process of forming a capacitor of MIM (Metal Insulator Metal) structure, dielectric breakdown of a capacitor insulating film while a relative dielectric constant of a metal oxide film used as the capacitor insulating film is kept high.

5 Claims, 9 Drawing Sheets

SEMICONDUCTOR DEVICE AND METHOD FOR MANUFACTURING SAME

This is a Continuation of application Ser. No. 10/746,341 filed Dec. 29, 2003, now U.S. Pat. No. 6,903,398.

BACKGROUND OF THE INVENTION

1. Field of the Invention

The present invention relates to a semiconductor device and a method for manufacturing the same and more particularly to the semiconductor device having a capacitor of MIM (Metal insulator Metal) structure and the method for manufacturing the same.

The present application claims priority of Japanese Patent Application No. 2002-380063 filed on Dec. 27, 2002, which is hereby incorporated by reference.

2. Description of the Related Art

An LSI (Large Scale Integrated Circuit) being known as a typical semiconductor device is roughly classified into two, one being a memory device and another being a logic device and, as semiconductor manufacturing technology advances in recent years, progress of the memory device in particular is remarkable. Moreover, the memory device is also classified into two, one being a DRAM (Dynamic Random Access Memory) and another being an SRAM (Static Random Access Memory) and most of these memory devices are made up of a MOS (Metal Oxide Semiconductor)-type transistor because it is excellent in points of integration degree. In the case of the DRAM in particular, since the merit of high integration as mentioned above can be exploited more when compared with the SRAM, manufacturing costs of DRAMs can be reduced and, therefore, the DRAM is widely used in various kinds of memory devices such as information devices or a like. Moreover, an embedded DRAM in which the DRAM and logic device are integrally formed on same one chip is becoming widespread recently.

One memory cell of a DRAM is made up of a memory selecting transistor constructed of a MOS-type transistor to perform switching operations and of a capacitor being connected to the memory selecting transistor and stores information depending on presence or absence of a charge of the capacitor. Here, as information to be stored increases due to progress of recent information society, a limitation is imposed on an area that can be occupied by the capacitor formed on a semiconductor chip and, therefore, contrivance to increase capacity of the capacitor in each memory cell is needed. If the capacitor does not have sufficient capacity enough to store information, charges of the capacitor decrease due to influences by extrinsic noise signals or a like, thus causing occurrence of a malfunction such an error as typified by a soft error.

Conventionally, as a capacitor insulating film for a capacitor in a DRAM, a silicon oxide ($SiO_2$) film, a silicon nitride (SiN) film, a silicon nitride oxide (SiON) film obtained by combining the above two films, or a like are widely used, however, in order to ensure more larger capacity, there is a recent tendency that a metal oxide film having a relative dielectric constant (relative permittivity) being higher than that of such the insulating films as described above is employed. Moreover, as a lower electrode (storage electrode) and an upper electrode (plate electrode) which make up a capacitor by being combined with the capacitor insulating film, a polycrystalline silicon film is used which can be formed easily by deposition in a manufacturing process of a MOS-type transistor. However, in general, a polycrystalline silicon film is manufactured by a CVD (Chemical Vapor Deposition) method which includes a high temperature process at time of deposition and during a thermal process of activating impurities in films subsequent to the deposition process, and there is a fear that, during the high temperature thermal process, a MOS transistor making up the memory selecting transistor or logic device or a like as described above already formed in a semiconductor substrate is thermally affected and deteriorated. Therefore, a capacitor of, so-called MIM structure is employed in which a metal being able to be deposited at a temperature being so low that it does not exert a thermal influence on the MOS transistor is used as a material for the lower electrode and upper electrode described above.

A semiconductor device having a capacitor using an amorphous aluminum oxide ($Al_2O_3$) film as a capacitor insulating film of such the capacitor as described above is disclosed in, for example, Japanese Patent Application Laid-open No. Hei 11-233726.

The capacitor of the conventional semiconductor device, as shown in FIG. 7, includes a lower electrode 200 made up of, for example, a polycrystalline silicon film so formed as to be connected to an active region through a contact hole formed in an interlayer insulating film (interlayer dielectric) which covers a semi-conductor substrate 100 having the active region, a capacitor insulating film 400 made up of an amorphous aluminum oxide which covers the lower electrode 200, an upper electrode 500 made up of, for example, a polycrystalline silicon film which covers the capacitor insulating film 400, and a reaction preventing film 300 made up of, for example, a silicon nitride film formed between the lower electrode 200 and capacitor insulating film 400 which is formed if necessary. The amorphous aluminum oxide film making up the capacitor insulating film 400 is deposited by, for example, an ALD (Atomic Layer Deposition) method so as to have a desired thickness. It is conventionally reported that, by forming capacitors having such the configurations as described above, difficulties in employing capacitors having structure such as MIM structure or MIS (Metal Insulator Semiconductor) structure can be solved.

However, the capacitor employed in the conventional semiconductor device disclosed in the above Japanese Patent Application Laid-open No. Hei 11-233726 has a problem in that, since a relative dielectric constant of the amorphous aluminum oxide film making up the capacitor insulating film 400 is as low as about 10, sufficient capacity cannot be obtained. Moreover, since a heat treatment process at high temperatures of 800° C. to 950° C. is performed after the formation of the lower electrode 200 made up of, for example, the polycrystalline silicon film in the capacitor, as described above, the active region already formed in the semiconductor substrate 100 is thermally affected during the heat treatment process.

Also, another semiconductor device having a capacitor of MIM structure using a metal oxide film such as a zirconium oxide ($Z_xO_2$) film, hafnium oxide ($HfO_2$) film, or a like as a capacitor insulating film of its capacitor as described above is disclosed in Japanese Patent Application Laid-open No. 2002-222934. An MIM-type capacitor of the disclosed conventional semiconductor device, as shown in FIGS. 8A and 8B, includes a p-type silicon substrate 101, an N-type diffusion layer 102 formed in a specified region on the p-type silicon substrate 101, an interlayer insulating film 103 made up of a silicon oxide film formed on the p-type silicon substrate 101, a plug 104 made up of a tungsten film, a lower electrode 105 made up of a ruthenium dioxide ($RuO_2$) film, a titanium nitride (TiN) film, a tantalum nitride (TaN) film, a tungsten nitride (WN) film, or a like formed in a manner so as to be connected to the plug 104 through a contact hole formed in part of the interlayer insulating film 103, a capacitor insulating film 108 having a first dielectric film (barrier insulating layer) 106 made up of an alumina film (aluminum oxide film) and a second dielectric film (high relative dielectric constant film) 107 made up of a metal oxide film of a zirconium oxide film, a hafnium oxide film, a tantalum pentaoxide ($Ta_2O_5$) or a like, an upper electrode 109 made up of a tungsten (W) film, a titanium nitride (TiN) film, a tantalum nitride (TaN) film, a tungsten nitride (WN) film, or a like. The alumina film making up the first dielectric film 106 serves to provide a strong adherence between the interlayer insulating film 103 and the lower electrode 105, thus enabling formation of a high-quality capacitor. The alumina film making up the first dielectric film 106 in the capacitor insulating film 108 and the metal oxide film such as the zirconium oxide film, hafnium oxide film, tantalum pentaoxide film or the like are deposited by, for example, the ALD method so as to have a desired thickness. It is thus reported that, by forming a capacitor having such configurations as above, high quality capacitor insulating film having a small dependence of a leak current on an operating temperature can be formed.

However, the capacitor employed in the conventional semiconductor device disclosed in the above Japanese Patent Application Laid-open No. 2002-222934 also has a problem in that, when a capacitor of MIM structure is formed, since the metal oxide film having a high relative dielectric constant and making up the capacitor insulating film is a crystal film, dielectric breakdown easily occurs in the capacitor insulating film due to a grain boundary existing in the crystal film when a voltage is applied to the capacitor, thus causing reduction in reliability of semiconductor devices. For example, an explanation for the above is made by using the case disclosed in the above Japanese Patent Application Laid-open No. 2002-222934 in which the zirconium oxide film is used as the capacitor insulating film. That is, as shown in FIGS. 8A and 8B, after the lower electrode 105 made up of, for example, a ruthenium dioxide ($RuO_2$) film has been formed in a manner so as to be connected to the plug 104, if the zirconium oxide film is deposited by the ALD method subsequent to the formation of the first dielectric film 106 made up of an alumina film, since the resulting zirconium oxide film is in a state appearing immediately after the deposition and is in a polycrystalline film state, a grain boundary exists. Therefore, after the capacitor has been obtained by forming the upper electrode 109 on the capacitor insulating film 108 made up of the zirconium oxide film, when the semiconductor is operated and a voltage is applied to the capacitor, since electrical continuity through the grain boundary existing in the zirconium oxide film occurs between the lower electrode 105 and the upper electrode 109, dielectric breakdown easily occurs in the capacitor insulating film 108. As a result, since probability becomes high that an operation failure occurs in the capacitor, which causes reduction in reliability of a semiconductor device being a DRAM.

SUMMARY OF THE INVENTION

In view of the above, it is an object of the present invention to provide a semiconductor device which is capable of preventing, in a process of forming a capacitor of MIM structure, dielectric breakdown of a capacitor insulating film while a relative dielectric constant of a metal oxide film used as the capacitor insulating film is kept high and a method for manufacturing the semiconductor.

According to a first aspect of the present invention, there is provided a semiconductor device including:

a capacitor of MIM (Metal Insulator Metal) structure including a lower electrode and an upper electrode each made up of a metal film, and a capacitor insulating film sandwiched between the lower electrode and the upper electrode;

wherein the capacitor insulating film is an amorphous metal oxide film consisting essentially of aluminum, a metal other than aluminum and oxygen, and a ratio "X" of a number of aluminum atoms to a sum of numbers of the aluminum atoms and the metal atoms other than the aluminum atom is set to be $0.05 \leq X \leq 0.3$.

In the foregoing first aspect, a preferable mode is one wherein the metal other than the aluminum has a strong tendency to crystallize with oxygen.

Also, a preferable mode is one wherein the capacitor insulating film has a film thickness of 5 nm to 20 nm.

Also, a preferable mode is one wherein the metal other than the aluminum is at least any one selected from a group of zirconium, hafnium, or lanthanoid group element.

Also, a preferable mode is one, wherein the upper electrode and the lower electrode are made of titanium nitride, tantalum nitride, or tungsten nitride.

Also, a preferable mode is one, wherein the capacitor insulating film is formed by an ALD method or a CVD method.

According to a second aspect of the present invention, there is provided a method for manufacturing a semiconductor device having a capacitor of MIM (Metal Insulator Metal) structure including a lower electrode and an upper electrode each made up of a metal film, and a capacitor insulating film made up of a metal oxide film and sandwiched between the lower electrode and the upper electrode, the method including:

a transistor forming process of forming a memory cell selecting transistor which performs switching operations in a desired position of a semiconductor substrate;

a plug forming process of forming, after having deposited interlayer insulating film on the memory cell selecting transistor, a contact hole on the interlayer insulating film in a manner so as to expose part of an operation region of the memory cell selecting transistor and forming a capacitor contact plug in a manner so as to be connected through the contact hole to the operation region.

a lower electrode forming process of forming the lower electrode made up of a metal film making up part of the capacitor in a manner so as to be connected to the capacitor contact plug;

a capacitor insulating film forming process of forming, on the lower electrode, an amorphous capacitor insulating film making up part of the capacitor having its composition of Al—M—O (where a ratio "X" of a number of aluminum atoms to a sum of numbers of the aluminum atoms and the metal atoms other than the aluminum atom is set to be $0.05 \leq X \leq 0.3$) by exposing the semiconductor substrate on which the lower electrode has been formed into an atmosphere including a compound containing a metal atom having a strong tendency to form crystalline dielectric with oxygen, oxidizing agent, and compound containing an aluminum atom; and an upper electrode forming process of forming, on the capacitor insulating film, said upper electrode made up of a metal film which makes up part of said capacitor.

In the foregoing second aspect, a preferable mode is one wherein, in the lower electrode forming process, after a further interlayer insulating film has been formed on the interlayer insulating film, a further contact hole is formed in the further interlayer insulating film in a manner so as to expose the capacitor contact plug, whereby the lower electrode made up of a metal film and making up part of the capacitor is formed in a manner so as to be connected through the further contact hole to the capacitor contact plug.

Also, a preferable mode is one wherein, in the capacitor insulating film forming process, the semiconductor substrate is exposed in an atmosphere into which each of the compound containing a metal atom being able to form crystalline dielectric, the oxidizing agent, and the compound containing an aluminum atom is fed with different timing.

Also, a preferable mode is one, wherein, when a combination of a period during which the compound containing a metal atom being able to form the crystalline dielectric is fed and a period during which the oxidizing agent is subsequently fed is defined to be a unit operation cycle, by repeating the unit operation cycle, the crystalline dielectric is formed so as to have a desired thickness.

Also, a preferable mode is one, wherein, when the crystalline dielectric is formed by repeating the unit operation cycle, control is exerted so that a film thickness of the crystalline dielectric to be formed every the unit operation cycle is about 4 nm or less.

Also, a preferable mode is one, wherein, when a combination of a period during which the compound containing an aluminum atom is fed and a period during which the oxidizing agent is subsequently fed is defined to be a unit operation cycle, by repeating the unit operation cycle, the amorphous aluminum oxide film is formed so as to have a desired thickness.

Also, a preferable mode is one, wherein, in the capacitor insulating film forming process, the semiconductor substrate is exposed in an atmosphere into which each of the compound containing a metal atom being able to form the crystalline dielectric, the oxidizing agent, and the compound containing an aluminum atom is fed with same timing.

Also, a preferable mode is one, wherein, as a metal being able to form the crystalline dielectric, zirconium, hafnium, or lanthanoid group element is used.

Furthermore, a preferable mode is one, wherein, as the upper electrode and the lower electrode, titanium nitride, tantalum nitride, or tungsten nitride is used.

With the above configuration, the capacitor insulating film of the capacitor of the semiconductor device of the present invention is made up of an amorphous film obtained by having crystalline dielectric contain amorphous aluminum oxide and having its composition of $Al_XM_{(1-X)}O_Y$ (where "M" denotes a metal that can form crystalline dielectric; $0.05 \leq X \leq 0.3$) and, therefore, a high crystallizing temperature can be maintained while a relative dielectric constant is kept high.

With another configuration as above, the capacitor insulating film having its composition of $Al_XM_{(1-X)}O_Y$ ($0.05 \leq X \leq 0.3$) is deposited by the ALD method and therefore it is made possible to form the capacitor insulating film of high quality. As a result, in a process of forming the capacitor of MIM structure, dielectric breakdown of the capacitor insulating film can be prevented while a relative dielectric constant of the metal oxide film making up the capacitor insulating film is kept high.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
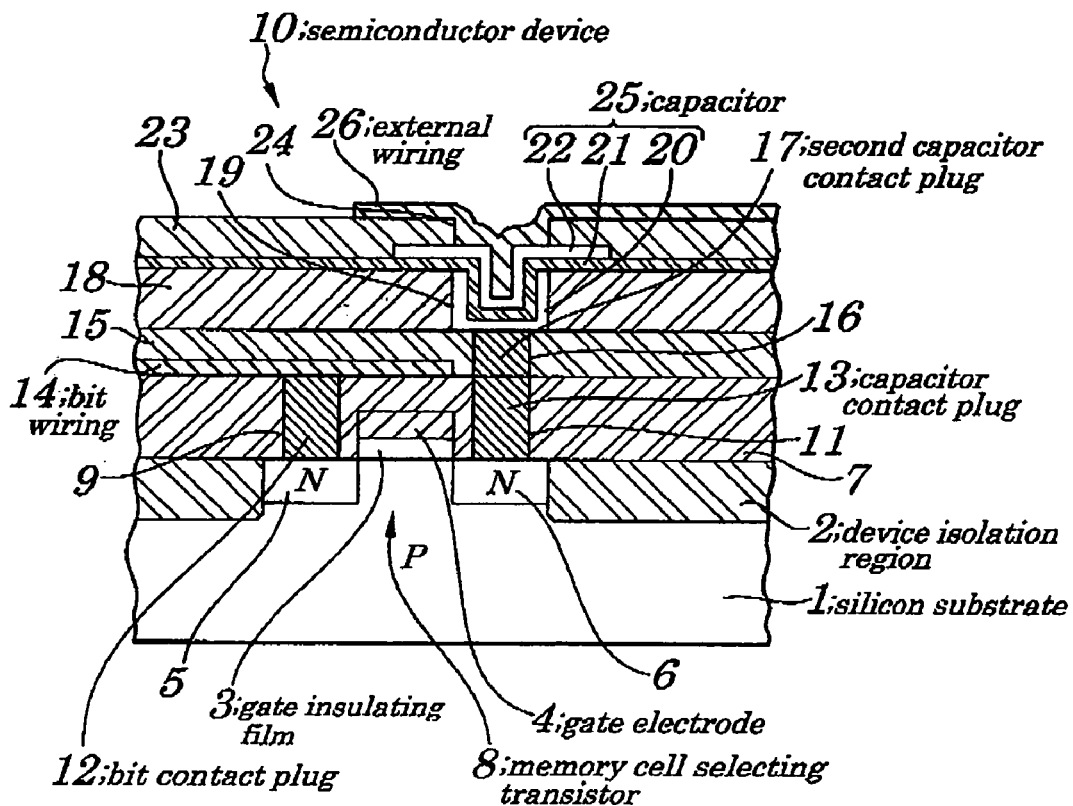
FIG. 1 is a cross-sectional view illustrating configurations of a semiconductor device according to a first embodiment of the present invention.
Figure 2:
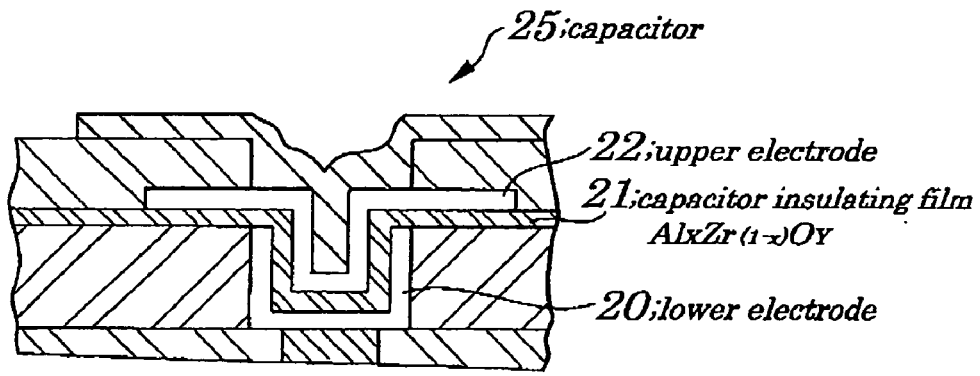
FIG. 2 is an expanded cross-sectional view illustrating configurations of a capacitor serving as a main part of the semiconductor device according to the first embodiment of the present invention.
Figure 3:
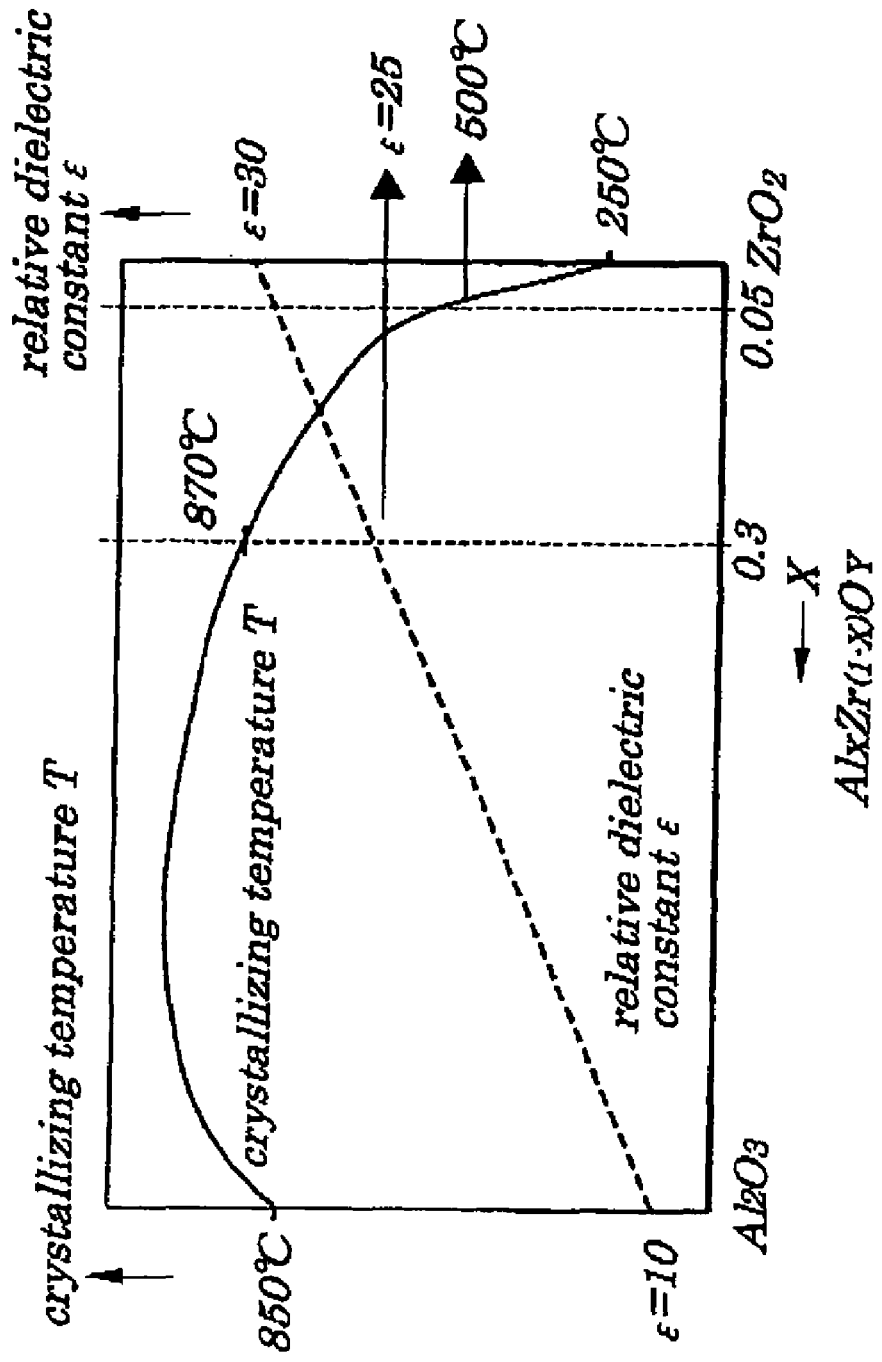
FIG. 3 is a diagram explaining a relative dielectric constant of a capacitor insulating film of the capacitor of the semiconductor device and an optimum range of a crystallizing temperature according to the first embodiment of the present invention.
Figure 4A:
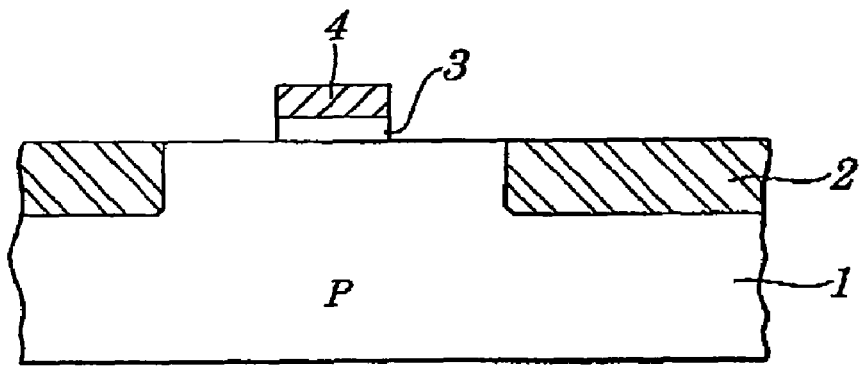
FIGS. 4A to 4C are diagrams showing a manufacturing method for the semiconductor device, in order of processes, according to the first embodiment of the present invention.
Figure 5:
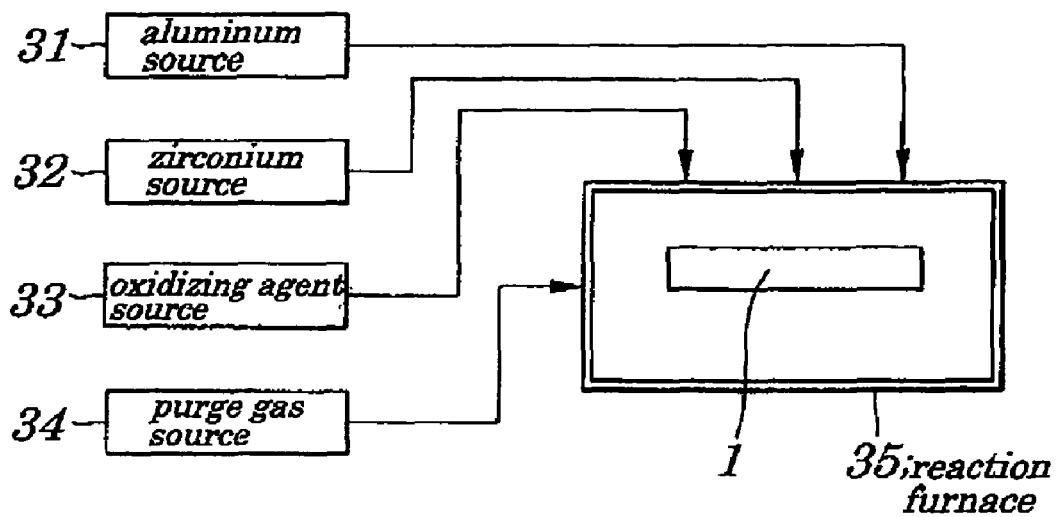
FIG. 5 is a diagram briefly explaining a process for deposition of the capacitor insulating film employed in the manufacturing method for the semiconductor device according to the first embodiment of the present invention.
Figure 6:
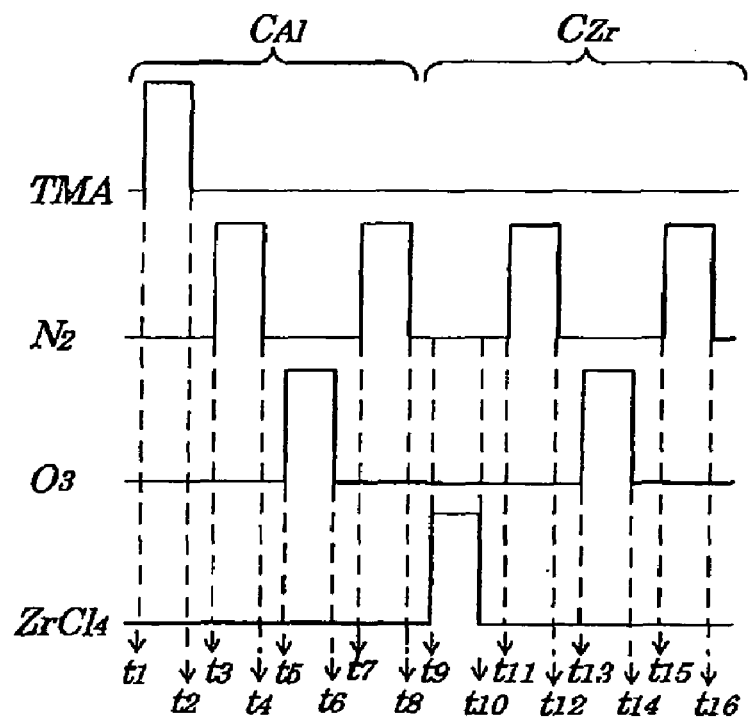
FIG. 6 is a diagram showing a sequence of deposition of the capacitor insulating film employed in the manufacturing method for the semiconductor device according to the first embodiment of the present invention.
Figure 7:
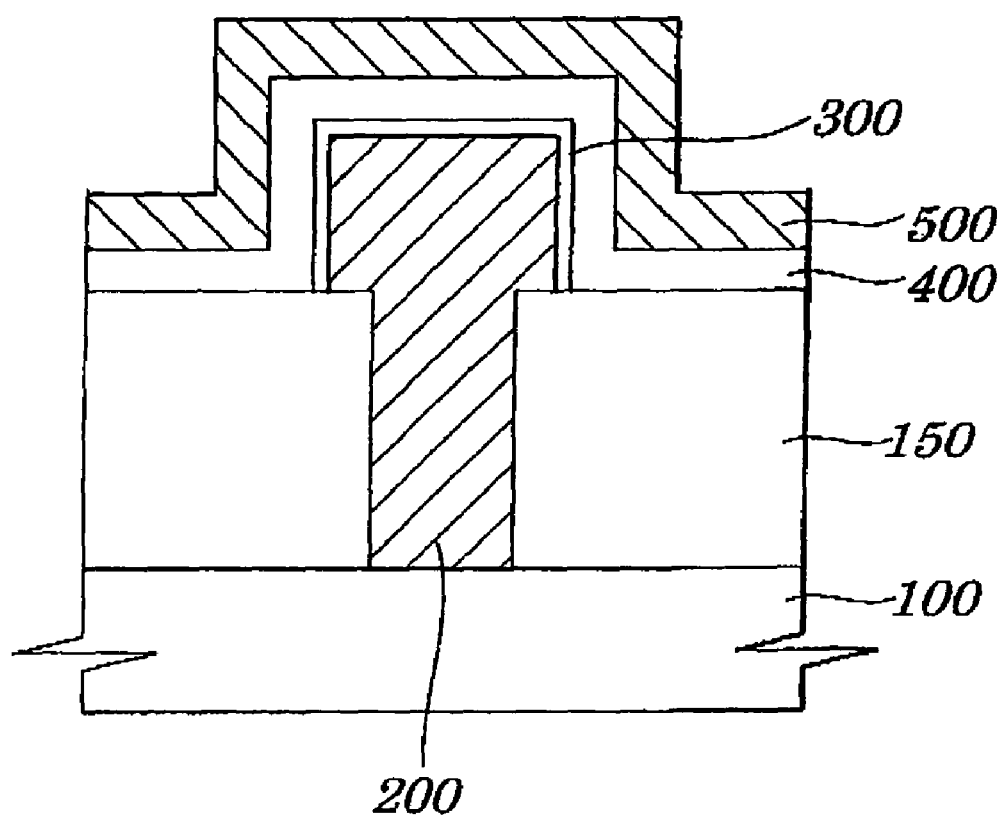
FIG. 7 is a cross-sectional view illustrating configurations of a conventional semiconductor device.
Figure 8A:
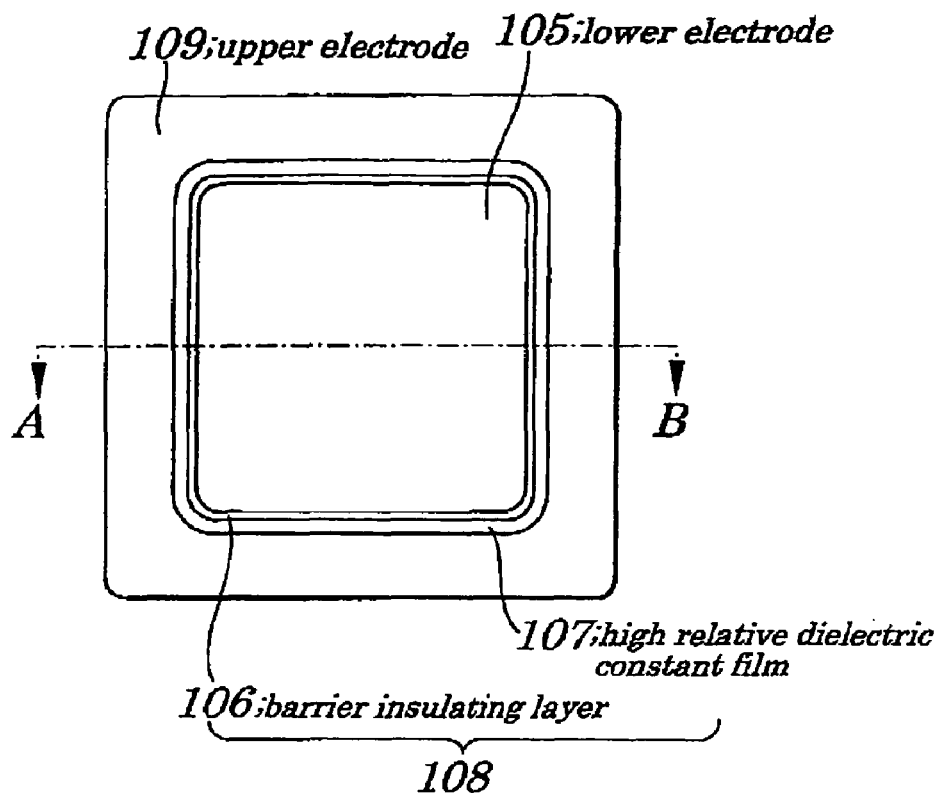
FIG. 8A is a top view illustrating configurations of another conventional semiconductor device and FIG. 8B is a cross-sectional view illustrating configurations, taken along a line A-B, of the other conventional semiconductor device of FIG. 8A.
Figure 8B:
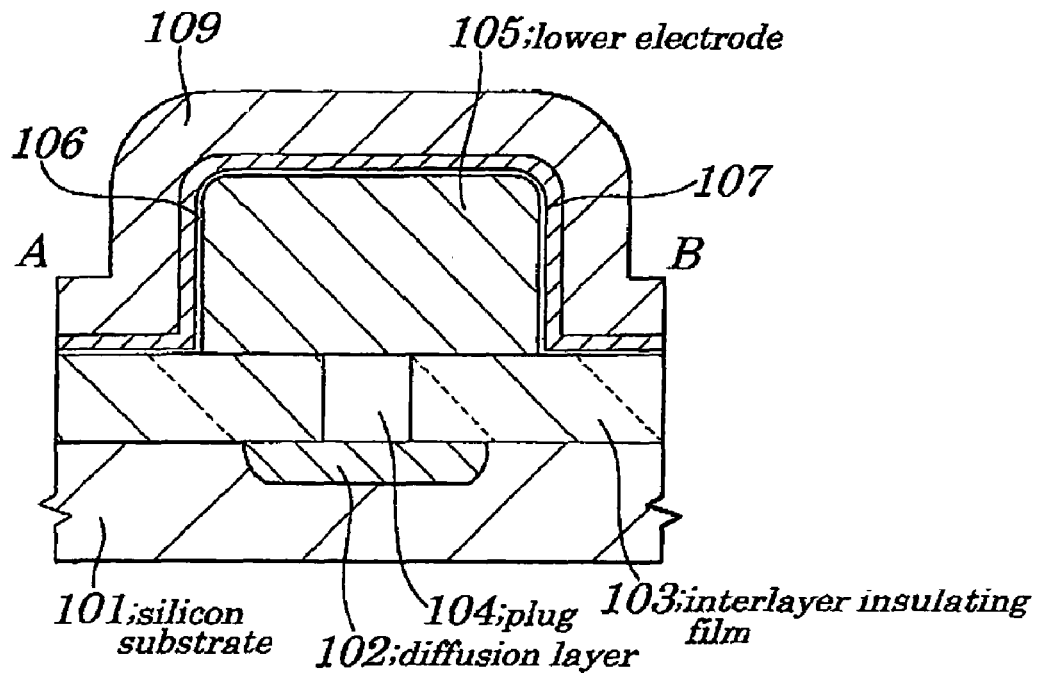

FIG. 1 is a cross-sectional view for schematically illustrating configurations of a semiconductor device according to a first embodiment of the present invention. FIG. 2 is an expanded cross-sectional view illustrating configurations of a capacitor serving as a main part of the semiconductor device according to the first embodiment. FIG. 3 is a diagram explaining a relative dielectric constant of a capacitor insulating film of the capacitor of the semiconductor device and an optimum range of a crystallizing temperature according to the first embodiment. FIGS. 4A to 4K are diagrams showing a manufacturing method for the semiconductor device, in order of processes, according to the first embodiment. FIG. 5 is a diagram briefly explaining a process for deposition of the capacitor insulating film employed in the manufacturing method for the semiconductor device according to the first embodiment. FIG. 6 is a diagram showing a sequence of deposition of the capacitor insulating film employed in the manufacturing method for the semiconductor device according to the first embodiment. In the first embodiment, a DRAM is taken as an example of the semiconductor device. The semiconductor device 10 of the embodiment, as shown in FIG. 1, includes a memory cell selecting transistor 8 mounted in a desired location of, for example, a P-type silicon substrate 1 made of and a capacitor 25 formed so as to be connected to an N-type region 6 serving as one operating region of the memory cell selecting transistor 8. The capacitor 25 includes a lower electrode 20 made up of, for example, a titanium nitride film, a capacitor insulating film 21 made of zirconium aluminate being an amorphous film obtained by mixing amorphous aluminum oxide ($Al_2O_3$) into zirconium oxide ($ZrO_2$) being crystalline dielectric, and having its composition of $Al_XZr_{(1-X)}O_Y$ ("X" denotes a ratio of the composition; $0.05 \leq X \leq 0.3$), and an upper electrode 22 made up of, for example, a titanium nitride film. The capacitor insulating film 21 having such the composition as described above is deposited by using an ALD method (described later) or a CVD method (described later).

In the P-type silicon substrate 1 is formed an device isolation region 2 by a well-known LOCOS (Local Oxidation of Silicon) method or an STI (Shallow Trench Isolation) method and in a central portion of the active region surrounded by the device isolation region 2 are formed a gate insulating film 3 made up of, for example, a silicon oxide film and a gate electrode 4 made up of a polycrystalline silicon film. The gate electrode 4 is connected to word wirings (not shown) making up the DRAM. By a self alignment process using the gate electrode 4, in the above active region is implanted an N-type impurity such as phosphorus (P) or arsenic (As) which forms a pair of an N-type region 5 and an N-type region 6, one serving as a source region and another serving as a drain region. When necessary, the pair of the N-type regions 5 and 6 are so formed as to be of well-known LDD (Lightly Doped Drain) structure and a side wall insulating film is formed on a side of the gate electrode 4. Thus, in a desired region, on the P-type silicon substrate 1 are formed the gate electrode 4 and the memory cell selecting transistor 8 including the pair of the N-type regions 5 and 6.

In a first interlayer insulating film 7 made up of, for example, a silicon oxide film and formed on and throughout a present surface of a device in process whereby the memory cell selecting transistor 8 is covered with the first interlayer insulating film 7, contact holes 9 and 11 are formed in a manner that the contact hole 9 exposes the N-type region 5 and that the contact hole 11 exposes the N-type region 6. In the contact hole 9, a bit contact plug 12 made of, for example, tungsten is formed in a manner so as to be connected to the N-type region 5 on the one side. In the contact hole 11, a capacitor contact plug 13, made of, for example, tungsten is formed in a manner so as to be connected to the N-type region 6 on the other side. Moreover, in the first interlayer insulating film 7, a bit wiring 14 made of, for example, tungsten is formed in a manner so as to be connected to the bit contact plug 12.

In a second interlayer insulating film 15 made up of, for example, a silicon oxide film and formed on and throughout a present surface of a device in process whereby the first interlayer insulating film 7 is covered with the second interlayer insulating film 15, a contact hole 16 is formed in a manner so as to expose the capacitor contact plug 13. In the contact hole 16, a second capacitor contact plug 17 made of, for example, tungsten in a manner so as to be connected to the capacitor contact plug 13. Moreover, in a third interlayer insulating film 18 made up of, for example, a silicon oxide film and formed on and throughout a present surface of a device in process whereby the second interlayer insulating film 15 is covered with third interlayer insulating film 18, a contact hole 19 is formed in a manner so as to expose the second capacitor contact plug 17. In the contact hole 19, the capacitor 25 is formed which is connected to the second capacitor contact plug 17. The capacitor 25, as described above, includes the lower electrode 20 made up of a titanium nitride film, the capacitor insulating film 21 made up of an amorphous film obtained by mixing amorphous aluminum oxide ($Al_2O_3$) into zirconium oxide ($ZrO_2$) and having its composition of $Al_XZr_{(1-X)}O_Y$ ($0.05 \leq X \leq 0.3$), and the upper electrode 22 made up of a titanium nitride film. The lower electrode 20 is connected to the second capacitor contact plug 17.

In a fourth interlayer insulating film 23 made up of, for example, a silicon oxide film and formed on and throughout a present surface of a device in process whereby the capacitor 25 is covered with the fourth interlayer insulating film 23, a contact hole 24 is formed in a manner so as to expose the upper electrode 22 in the capacitor 25. In the contact hole 24, an external wiring 26 made up of, for example, tungsten is formed in a manner so as to be connected to the upper electrode 22 and is connected to peripheral circuits. Moreover, in FIG. 1, the contact hole 24 is formed immediately above the contact hole 19, however, the contact hole 24 may be formed in a flat region of the upper electrode 22 on the third interlayer insulating film 18.

The capacitor 25, as shown in FIG. 2, has its composition of $Al_XZr_{(1-X)}O_Y$ ($0.05 \leq X \leq 0.3$) in which the lower electrode 20 made up of a titanium nitride film having a thickness of 20 nm to 50 nm and the upper electrode 22 made up of a titanium nitride film having a thickness of 20 nm to 50 nm are formed respectively on lower and upper sides of the capacitor insulating film 21 made of zirconium aliminate being an amorphous film having a thickness of 5 nm to 15 nm, the capacitor insulating film 21 being sandwiched between the lower electrode 20 and the upper electrode 22.

The zirconium aluminate being an amorphous film having the composition described above being used as a material for the capacitor insulating film 21 in the capacitor 25 is one that can prevent dielectric breakdown while its relative dielectric constant is kept high. Moreover, the zirconium aluminate being an amorphous film can be kept in an amorphous state as the capacitor insulating film 21, without being thermally affected in various thermal treatment processes performed after the formation of the capacitor 25. That is, in the manufacturing of semiconductor devices 10, generally, various processes of thermal treatment at temperatures of 400° C. to 500° C. are performed even after the formation of the capacitor 25 and therefore it is essentially required that the capacitor insulating film 21 making up the capacitor 25 can be kept in an amorphous state and is not crystallized even in the thermal treatment. If the capacitor insulating film 21 is crystallized by such the thermal treatment, dielectric breakdown occurs easily as described above, which causes reduction in reliability of semiconductor devices 10.

The inventor of the present invention found from an experiment that, when amorphous zirconium aluminate is formed by mixing amorphous aluminum oxide into zirconium oxide being crystalline dielectric with a high relative dielectric constant (about 30) so as to have its composition of $Al_XZr_{(1-X)}O_Y$ and when its composition ratio is changed so that the composition ratio X is selected to be within a specified range ($0.05 \leq X \leq 0.3$) as described above, the relative dielectric constant of zirconium aluminate can be kept high and a crystallizing temperature at which crystallization of zirconium aluminate occurs is maintained at a high temperature, that is, dielectric breakdown of the capacitor insulating film can be prevented while the relative dielectric constant of zirconium aluminate is kept high.

FIG. 3 is a diagram showing relations among the composition ratio X of zirconium aluminate (horizontal axis), a relative dielectric constant "ε" of zirconium aluminate (vertical axis on right side), and a crystallizing temperature T (vertical axis on left side) found when oxide obtained by mixing amorphous aluminum oxide ($Al_2O_3$) into zirconium oxide ($ZrO_2$) so that the composition ratio of zirconium and aluminum is Al/Zr=X/(1-X), that is, zirconium aluminate having its composition of $Al_X Zr_{(1-X)} O_Y$ is formed. In the embodiment, an example is described in which a thickness of zirconium aluminate is about 50 nm. As is apparent from FIG. 3, the relative dielectric constant "ε" changes linearly from about 10 obtained when 1 (one) is selected as the composition ratio "X" (that is, a case where only $Al_2O_3$ is contained) to about 30 obtained when 0 (zero) is selected as the composition ratio "X" (that is, a case where only $ZrO_2$ is contained). On the other hand, the crystallizing temperature T changes non-linearly from about 850° C. obtained when 1 (one) is selected as the composition ratio "X" to about 250° C. obtained when 0 (zero) is selected as the composition ratio "X". Therefore, by selecting the range (0.05≦X≦0.3) excluding a range in which the crystallizing temperature T becomes extremely low, zirconium aluminate can be formed which is able to maintain the crystallizing temperature T exceeding about 500° C. while the relative dielectric constant "ε" an be kept high so as to be about 25 or more. That is, if amorphous aluminum oxide is mixed into crystalline zirconium oxide at the rate as described above, lowering of the relative dielectric constant "ε" of zirconium aluminate can be suppressed and a crystallizing temperature T of zirconium aluminate can be significantly increased, when compared with a case where a large amount of aluminum oxide is contained in zirconium aluminate. Therefore, by using zirconium aliminate having its composition of $Al_X Zr_{(1-X)} O_Y$ (0.05≦X≦0.3) as the capacitor insulating film 21, dielectric breakdown can be prevented while the relative dielectric ratio is kept high.

Thus, according to the semiconductor device 10 of the embodiment, the capacitor insulating film 21 in the capacitor 25, since it is made of zirconium aluminate obtained by having zirconium oxide being crystalline dielectric contain amorphous aluminum oxide and having its composition of $Al_X Zr_{(1-X)} O_Y$ (0.05≦X≦0.3), can maintain the crystallizing temperature T being as high as 500° C. to 870° C. while maintaining the relative dielectric constant "ε" being as high as about 25 to 28. Therefore, in various thermal treatment processes after the formation of the capacitor 25, since the capacitor insulating film 21 can be kept in an amorphous state, dielectric breakdown of the capacitor insulating film 21 can be prevented while a relative dielectric constant is kept high, thus enabling an operation failure in a semiconductor device to be avoided and reliability in the semiconductor device to be improved.

Next, a method for manufacturing the semiconductor device of the embodiment will be described in order of processes by referring to FIGS. 4A to 4K. First, as shown in FIG. 4A, for example, in the P-type silicon substrate 1 is formed the device isolation region 2 by the well-known LOCOS (Local Oxidation of Silicon) method, the well-known STI (Shallow Trench Isolation) method, or a like and in a central portion of the active region surrounded by the device isolation region 2 are formed the gate insulating film 3 made up of, for example, silicon oxide film and the gate electrode 4 made up of a polycrystalline silicon film.

Figure 4B:
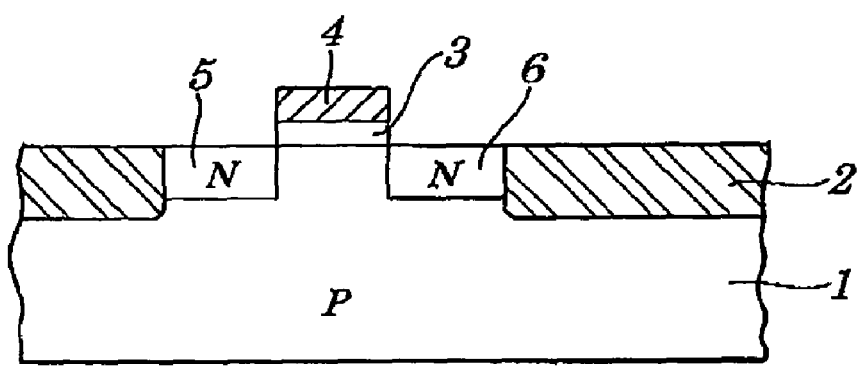

As shown in FIG. 4B, then, by a self alignment process using the gate electrode 4, in the above active region is implanted an N-type impurity such as phosphorus (P) or arsenic (As) which forms a pair of the N-type region 5 and the N-type region 6, one serving as a source region and another serving as a drain region.

Figure 4C:
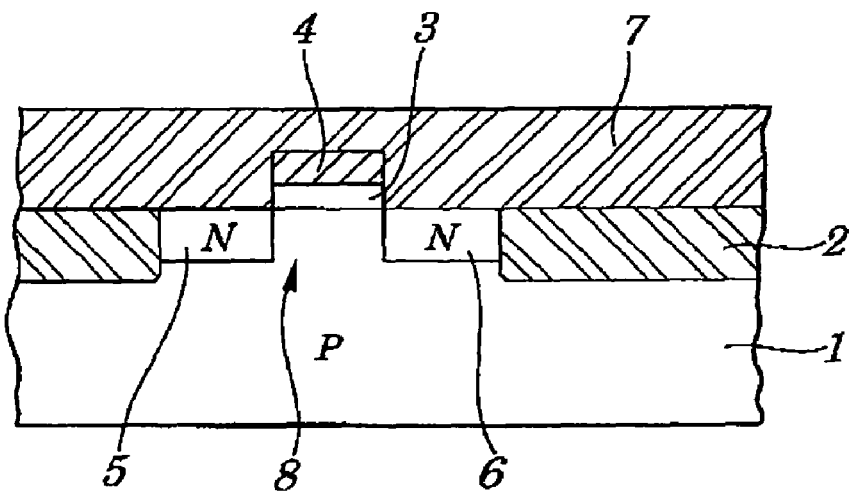

Then, as shown in FIG. 4C, by forming the first interlayer insulating film 7 made up of, for example, a silicon oxide film on and throughout a present surface of a device in process whereby the device isolation region 2 and N-type regions 5, 6 are covered with the first interlayer insulating film 7, by using the CVD method, the memory cell selecting transistor 8 made up of an NMOS (N-type Metal Oxide Semiconductor) transistor is completed. The memory cell selecting transistor 8 is made up of the pair of the N-type regions 5 and 6, the gate insulating film 3 and the gate electrode 4.

Figure 4D:
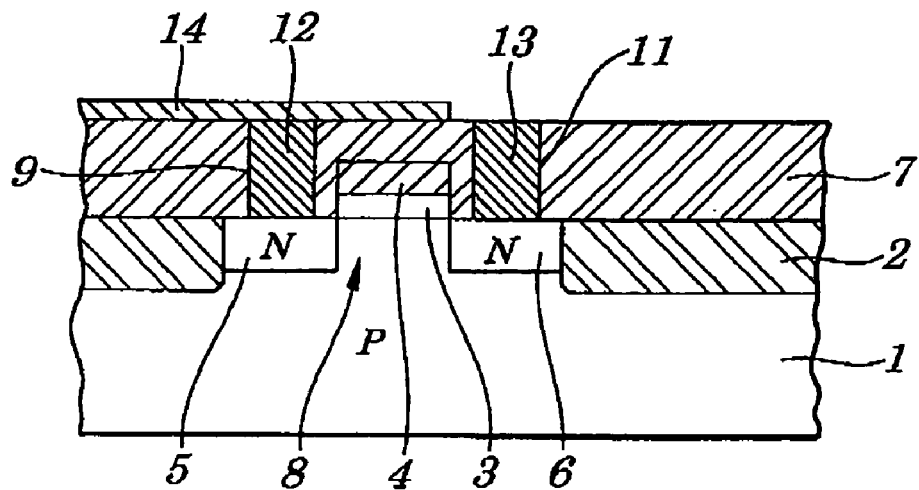
FIGS. 4D to 4F are diagrams showing the manufacturing method for the semiconductor device, in order of processes, according to the first embodiment of the present invention.

Next, as shown in FIG. 4D, after having formed the contact holes 9 and 11 in the first interlayer insulating film 7, by using a lithography method, in such a manner that the contact holes 9 and 11 expose a pair of the N-type region 5 and the N-type region 6 in the memory cell selecting transistor 8, the bit contact plug 12 made of, for example, tungsten is formed in the contact hole 9 by using the CVD method in a manner so as to be connected to the N-type region 5 and the capacitor contact plug 13 made of, for example, tungsten is formed in a manner so as to be embedded in the contact hole 11 and so as to be connected to the N-type region 6. Next, the bit wiring 14 made of, for example, tungsten is formed, by using the CVD method, on the first interlayer insulating film 7 in a manner so as to be connected to the bit contact plug 12.

Figure 4E:
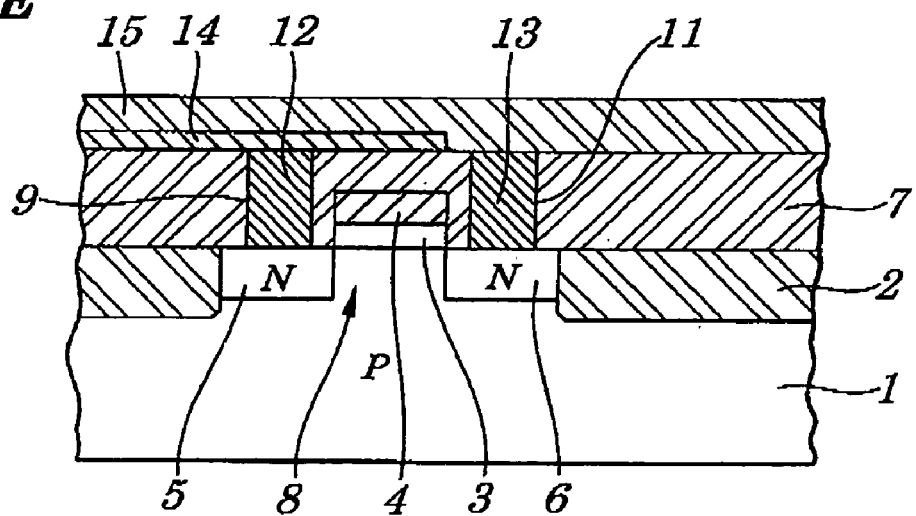
Figure 4F:
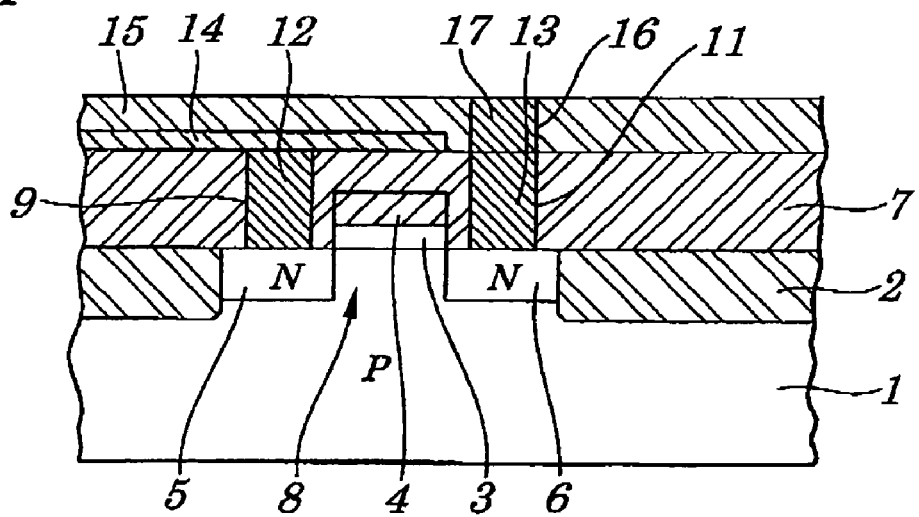

Next, as shown in FIG. 4E, the second interlayer insulating film 15 made of, for example, a silicon oxide film is formed by using the CVD method on and throughout a present surface of a device in process whereby the bit wiring 14, first interlayer insulating film 7, and capacitor contact plug 13 are covered with the second interlayer insulating film 15. Then, as shown in FIG. 4F, after the contact hole 16 has been formed by the lithography method in the second interlayer insulating film 15 in a manner so as to expose the capacitor contact plug 13, the second contact plug 17 made of, for example, tungsten is formed, by using the CVD method, in the contact hole 16 in a manner so as to be connected to the capacitor contact plug 13.

Figure 4G:
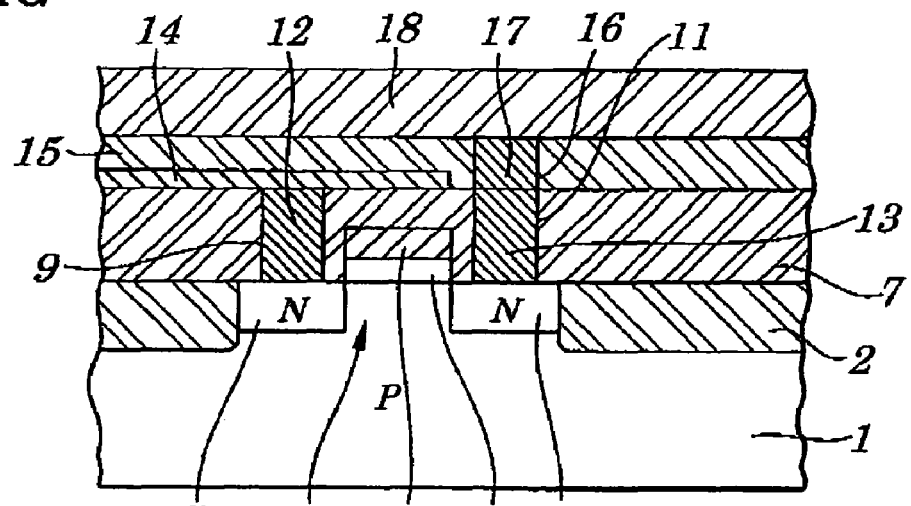
FIGS. 4G to 4I are diagrams showing the manufacturing method for the semiconductor device, in order of processes, according to the first embodiment of the present invention.
Figure 4H:
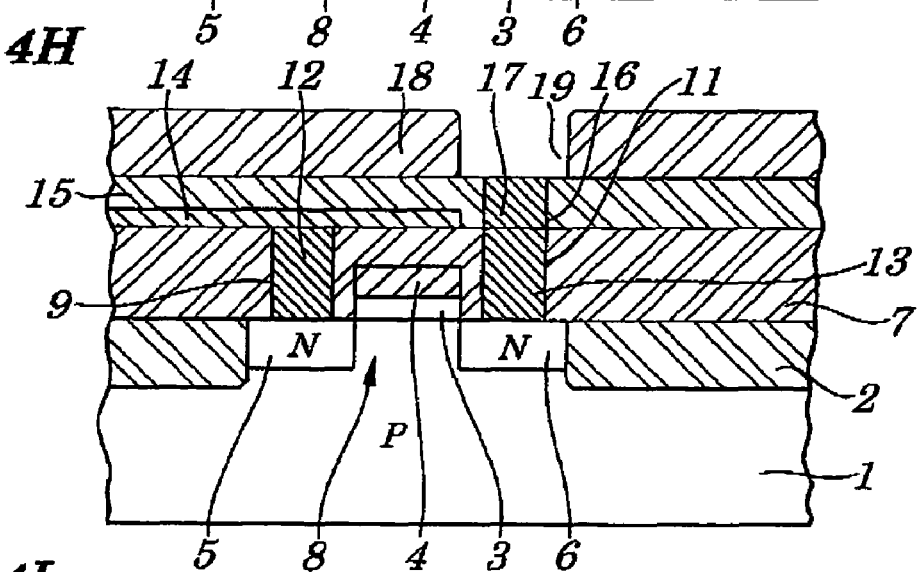

Next, as shown in FIG. 4G, the third interlayer insulating film 18 is formed, by using the CVD method, on and throughout a present surface of a device in process whereby the second interlayer insulating film 15 and the second contact plug 17 are covered with the third interlayer insulating film 18. Then, as shown in FIG. 4H, the contact hole 19 is formed, by the lithography, in the third interlayer insulating film 18 in a manner so as to expose the second capacitor contact plug 17.

Figure 4I:
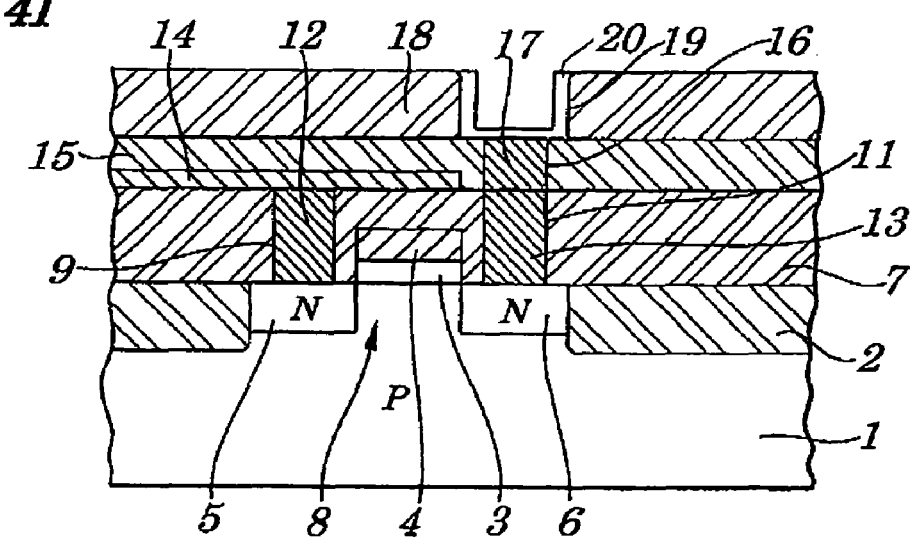

Then, after a lower electrode film made of, for example, a titanium nitride (TiN) film has been formed, by using the CVD method, on and throughout a present surface of a device in process whereby the contact hole 19 is covered with the lower electrode film, as shown in FIG. 4I, unwanted lower electrode films are removed by the lithography method and the lower electrode 20 is formed by the lower electrode film left within the contact hole 19.

Figure 4J:
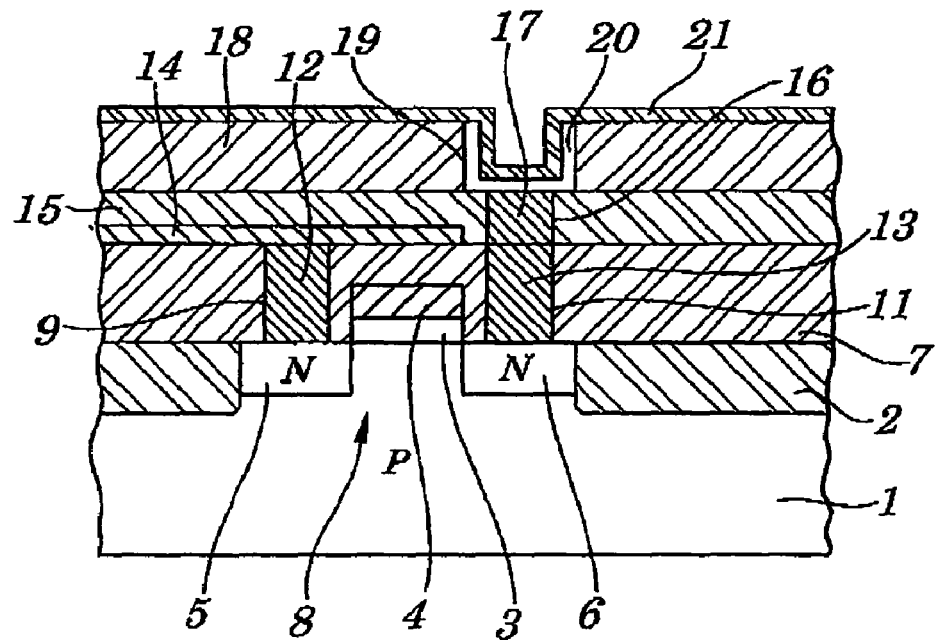
FIGS. 4J and 4K are diagrams showing the manufacturing method for the semiconductor device, in order of processes, according to the first embodiment of the present invention.

Next, as shown in FIG. 4J, the capacitor insulating film 21 made of zirconium aluminate being an amorphous film having its composition of $Al_X Zr_{(1-X)} O_Y$ (0.05≦X≦0.3) is formed on the lower electrode 20 according to the sequence for deposition as shown in FIG. 6. A method for deposition of the capacitor insulating film 21 by the ALD method is described below.

As shown in FIG. 5, with an aluminum source 31, a zirconium source 32, an oxidizing agent source 33, and a purge gas source 34 being connected in advance, to a reaction furnace 35 in a manner so that each of aluminum source, zirconium sorce, oxidizing agent, and purge gas can be fed with different timing from each other, the P-type silicon substrate 1 obtained immediately after the formation of the lower electrode 20 is put into the reaction furnace 35 being kept in an inert atmosphere. In the embodiment, as the aluminum source 31, zirconium source 32, oxidizing agent source 33, and purge gas source 34, for example, TMA (Trimethyl aluminum), zirconium tetrachloride ($ZrCl_4$), ozone ($O_3$), and nitrogen ($N_2$) are used respectively.

Next, a method for deposition is described according to the deposition sequence as shown in FIG. 6. During time t1 to t2, TMA is fed, with pulse-like timing, into the reaction furnace 35 from the aluminum source 31, with the P-type silicon substrate 1 being heated at 200° C. to 400° C. (deposition temperature). By this operation, one layer (1 mono-layer) of TMA adheres to all surfaces including a surface of the lower electrode 20 on the P-type silicon substrate 1.

Next, during time from t3 to t4, by feeding the nitrogen purge gas, with pulse-like timing, into the reaction furnace 35 from the purge gas source 34, excessive and unreacted TMA introduced to the reaction furnace 35 in the preceding process as performed during the time t1 to t2 is exhausted outside of the reaction furnace 35. Then, during time t5 to t6, ozone is fed to the reaction furnace 35 from the oxidizing agent source 33 with pulse-like timing. By this operation, oxygen reacts with TMA to produce one layer (1 mono-layer) of an aluminum oxide layer.

Next, during time from t7 to t8, by feeding the nitrogen purge gas, with pulse-like timing, into the reaction furnace 35 from the purge gas source 34, excessive and unreacted ozone introduced to the reaction furnace 35 in the preceding process as performed during the time t5 to t6 is exhausted outside of the reaction furnace 35. By a series of deposition processes performed during the time t1 to t8 described above, a deposition unit cycle $C_{Al}$ for one layer (1 mono-layer) of the aluminum oxide layer is completed.

Next, during time t9 to t10, zirconium tetrachloride is fed from the zirconium source 32 into the reaction furnace 35 with pulse-like timing. By this operation, one layer (1 mono-layer) of zirconium tetrachloride adheres to all surfaces of the aluminum oxide layer on the P-type silicon substrate 1.

Then, during time from t11 to t12, by feeding the nitrogen purge gas, with pulse-like timing, into the reaction furnace 35 from the purge gas source 34, excessive and unreacted zirconium tetrachloride introduced to the reaction furnace 35 in the preceding process as preformed during the time t9 to t10 is exhausted outside of the reaction furnace 35. Then, during time t13 to t14, ozone is fed from the oxidizing agent source 33 into the reaction furnace 35 with pulse-like timing. By this operation, oxygen reacts with zirconium tetrachloride to produce one layer (1 mono-layer) of a zirconium oxide layer.

Then, during time from t15 to t16, by feeding the nitrogen purge gas from the purge gas source 34, with pulse-like timing, into the reaction furnace 35, excessive and unreacted ozone introduced to the reaction furnace 35 in the preceding process as performed during the time t13 to t14 is exhausted outside of the reaction furnace 35. By a series of deposition processes during the time t9 to t16 described above, a deposition unit cycle $C_{Zr}$ for one layer (1 mono-layer) of the zirconium oxide layer is terminated.

In FIG. 6, an example of a process is shown in which one layer (1 mono-layer) of the aluminum oxide layer and one layer (1 mono-layer) of the zirconium oxide layer are formed. To produce the amorphous zirconium aluminate having its specified composition, a combination of the process in which the deposition unit cycle $C_{Al}$ for the formation of one layer (1 mono-layer) of the aluminum oxide layer is performed arbitrary "n" times and the process in which the deposition unit cycle $C_{Zr}$ for the formation of one layer (1 mono-layer) of the zirconium oxide layer is performed arbitrary "m" times, is repeated the required number of times. By using the produced amorphous zirconium aluminate having deposition as described above, the capacitor insulating film 21 having a specified thickness is obtained. Moreover, if, in one unit formation cycle, the zirconium oxide layer is formed so as to have a thickness exceeding about 4 nm, crystallization of the zirconium oxide film occurs and, therefore, consideration must be given to making the film thickness to be produced in one unit formation cycle not to exceed the value. Thus, according to the deposition method for the capacitor insulating film 21 using the ALD method, excessive and unreacted material components are exhausted in the course of the deposition, which enables formation of the capacitor insulating film of high quality.

Figure 4K:
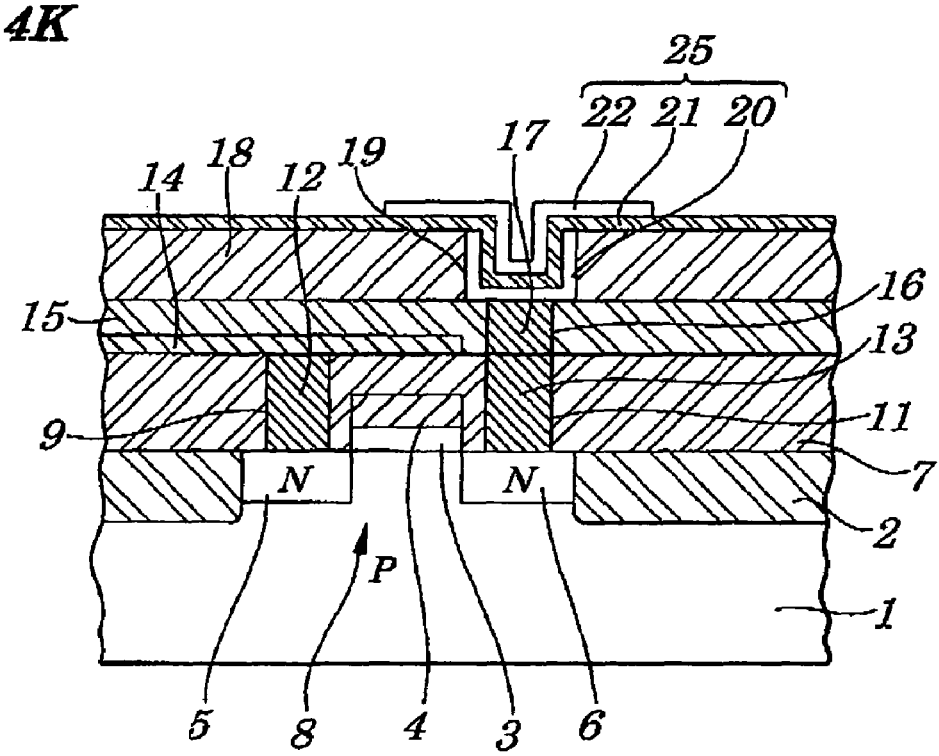

Next, after the upper electrode film made of, for example, a titanium nitride film has been formed, by using the CVD method, on and throughout a present surface of a device in process whereby the capacitor insulating film 21 is covered with the upper electrode film, as shown in FIG. 4K, unwanted upper electrode films are removed, by the lithography, to form the upper electrode 22. Thus, the capacitor 25 made up of the lower electrode 20, the capacitor insulating film 21, and the upper electrode 22 is formed.

Then, the semiconductor device 10 is obtained, as shown in FIG. 1, after having formed the fourth interlayer insulating film 23 using the CVD method, on an entire surface of the upper electrode 22 and capacitor insulating film 21, by forming, by the lithography, the contact hole 24 in the fourth interlayer insulating film 23 so as to expose the upper electrode 22 of the capacitor 25, and by drawing out the external wiring 26 made of, for example, tungsten from the contact hole 24 in a manner so as to be connected to the upper electrode 22.

Thus, according to the semiconductor device 10 of the embodiment, the capacitor insulating film 21 in the capacitor 25, since it is made of zirconium aluminate obtained by mixing amorphous aluminum oxide ($Al_2O_3$) into zirconium oxide ($ZrO_2$) being crystalline dielectric and having its composition of $Al_XZr_{(1-X)}O_Y$ ($0.05 \leq X \leq 0.3$), can maintain the crystallizing temperature T being as high as 500° C. to 870° C. while being able to keep the relative dielectric constant "$\epsilon$" as high as about 25 to 28.

Moreover, according to the method for manufacturing the semiconductor device 10 of the embodiment, since the capacitor insulating film 21 made of zirconium aluminate having the composition of $Al_XZr_{(1-X)}O_Y$ ($0.05 \leq X \leq 0.3$) is manufactured by the ALD method, it is made possible to form the capacitor insulating film of high quality. Therefore, in the process of forming the MIM-structured capacitor, dielectric breakdown of the capacitor insulating film can be prevented while the relative dielectric constant of the metal oxide film making up the capacitor insulating film is kept high.

Second Embodiment

A method for manufacturing semiconductor devices of a second embodiment differs greatly from that of the first embodiment in that, as a metal which can be used for forming crystalline dielectric, hafnium (Hf), instead of zirconium (Zr), is employed.

In the semiconductor device of the second embodiment, a capacitor insulating film is made of amorphous hafnium aluminate obtained by mixing amorphous aluminum oxide into hafnium oxide being crystalline dielectric, and having its composition of $Al_X Hf_{(1-X)}O_Y$ ($0.05 \leq X \leq 0.3$). That is, though, in a capacitor of a semiconductor device of the second embodiment, instead of amorphous zirconium aluminate used in the first embodiment, amorphous hafnium aluminate is used, relations among a composition ratio X of hafnium aluminate, relative dielectric constant "ε" of hafnium aluminate, and crystallizing temperature T are almost the same as those shown in FIG. 3 in the first embodiment, except that a dielectric constant (about 20) of hafnium oxide is different from that of the zirconium oxide.

Thus, also in the second embodiment, almost the same effect as obtained in the first embodiment can be achieved.

Third Embodiment

A method for manufacturing semiconductor devices of a third embodiment differs greatly from that of the first embodiment in that, as a metal which can be used for forming crystalline dielectric, a lanthanoid group element, instead of zirconium, is employed.

A capacitor insulating film of a capacitor in a semiconductor device of the third embodiment is made of amorphous lanthanoid aluminate obtained by having amorphous dielectric made of a lanthanoid group element contain amorphous aluminum oxide and having its composition of $Al_X Re_{(1-X)}O_Y$ ("Re" denotes a lanthanoid group element, $0.05 \leq X \leq 0.3$). The lanthanoide group element includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

That is, though, in the capacitor of the semiconductor device of the third embodiment, instead of amorphous zirconium aluminate, amorphous lanthanoid aluminate is used, relations among a composition ratio X of lanthanoid aluminate, relative dielectric constant "ε" of lanthanoid aluminate, and crystallizing temperature T are almost the same as those shown in FIG. 3 in the first embodiment, except that a dielectric constant (about 20 to 30) of lanthnoid oxide is different from that of the zirconium oxide.

Thus, also in the third embodiment, almost the same effect as obtained in the first embodiment can be achieved.

It is apparent that the present invention is not limited to the above embodiments but may be changed and modified without departing from the scope and spirit of the invention. For example, in the above embodiments, the ALD method is used for the deposition of the capacitor insulating film, however, not only the ALD method but also the CVD method may be used for the formation of the capacitor insulating film. In the case of the deposition by the CVD method, unlike in the case of using the ALD method, a compound containing a metal atom that can form the crystalline dielectric, oxidizing agent, and a compound containing an aluminum atom are fed at the same time. Moreover, in the above embodiments, zirconium tetrachloride being an inorganic material is used as the zirconium source, however, the present invention is not limited to this, that is, organic materials such as Zr $(NMe_2)_4$ (tetrakis (dimethylamino) zirconium), Zr $(NEt_2)_4$ (tetrakis (diethylamino) zirconium), and Zr $(NMeEt)_4$ (tetrakis (methylethylamino) zirconium) may be used. Also, in the above embodiments, as the lower electrode and upper electrode, the titanium nitride film is used, however, other metal films such as a tantalum nitride (TaN) film, tungsten nitride (WN) film, or a like may be employed. In the above embodiments, ozone is used as the oxidizing agent, however, other materials such as oxygen ($O_2$), water ($H_2O$), or a like may be used. Also, the example is shown in which the present invention is applied to a semiconductor of COB (Capacitor Over Bitline) structure in which the capacitor is placed in an upper position of the bit wiring, however, the present invention may be applied to a semiconductor of CUB (Capacitor Under Bitline) structure in which the capacitor is placed in a lower position of the bit wiring.

As a gate insulating film of a transistor making up a DRAM, a nitride film may be used or two-layered film made up of an oxide film and nitride film may be used. That is, so long as a transistor making up a DRAM is of MIS structure, not only a MOS (Metal Oxide Semiconductor)-type transistor but also a MNS (Metal Nitride Semiconductor)-type or MNOS (Metal Nitride Oxide Semiconductor)-type transistor may be used. Also, in each semiconductor region of the present invention, a P-type region and an N-type region may be used in a reversed manner.

As the interlayer insulating film, not only a silicon oxide film but also other insulating films such as a silicon nitride film, BSG (Boron-Silicate Glass) film, PSG (Phospho-Silicate Glass) film, or BPSG (Boron-Phospho-Silicate Glass) film may be used.

What is claimed is:

1. A semiconductor device comprising:
   a capacitor of a MIM (Metal Insulator Metal) structure comprising a lower electrode and an upper electrode each made up of a metal film, and a capacitor insulating film sandwiched between said lower electrode and said upper electrode;
   wherein said capacitor insulating film comprises an amorphous film comprising amorphous aluminum oxide and a crystalline dielectric and having a composition of $Al_x M_{(1-x)}O_y$ (where Al denotes an aluminum atom, M denotes a metal atom other than aluminum atom, the metal atom being able to form the crystalline dielectric, and O denotes an oxygen atom).

2. The semiconductor device according to claim 1, wherein said crystalline dielectric contains at least any one selected from a group of zirconium, hafnium, or a lanthanoid group element.

3. The semiconductor device according to claim 1, wherein said capacitor insulating film comprises said amorphous film being kept in an amorphous state, even if thermal treatment is performed after formation of said capacitor.

4. The semiconductor device according to claim 1, wherein said capacitor insulating film has a multilayer structure comprising at least one layer of said crystalline dielectric and at least one layer of said amorphous aluminum oxide.

5. The semiconductor device according to claim 1, wherein a film thickness for every one layer of said crystalline dielectric is about 4 nm or less.

* * * * *